(12) United States Patent
Chen et al.

(10) Patent No.: US 7,733,136 B2
(45) Date of Patent: Jun. 8, 2010

(54) FREQUENCY SYNTHESIZER

(75) Inventors: Chih-Hung Chen, Kaohsiung (TW);
Ming-Ching Kuo, Hsinchu (TW);
Shiau-Wen Kao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 50 days.

(21) Appl. No.: 12/108,843

(22) Filed: Apr. 24, 2008

(65) Prior Publication Data

US 2009/0108892 A1    Apr. 30, 2009

Related U.S. Application Data

(60) Provisional application No. 60/960,983, filed on Oct. 24, 2007.

(51) Int. Cl.
*H03L 7/06* (2006.01)
(52) U.S. Cl. .................. 327/148; 327/147; 327/151; 327/156; 327/157; 327/160
(58) Field of Classification Search .............. 327/156, 327/147; 375/376
See application file for complete search history.

(56) References Cited

U.S. PATENT DOCUMENTS

| 6,940,356 | B2 * | 9/2005 | McDonald et al. ............ 331/16 |
| 6,998,891 | B2 | 2/2006 | Hsu et al. |
| 7,082,176 | B2 | 7/2006 | Chien et al. |

* cited by examiner

*Primary Examiner*—Lincoln Donovan
*Assistant Examiner*—Daniel Rojas
(74) *Attorney, Agent, or Firm*—Finnegan, Henderson, Farabow, Garrett & Dunner, LLP

(57) ABSTRACT

A frequency synthesizer includes: a fractional-N synthesizer configured to provide, in a locked condition, an output signal with an output frequency based on an input signal with a reference frequency, the fractional-N synthesizer including a charge pump outputting a current to be calibrated; a lock detector coupled to the fractional-N synthesizer to detect the locked condition, the lock detector being configured to send a first signal indicating the detection; a calibration component coupled to the lock detector and the fractional-N synthesizer, the calibration component being configured to provide a second signal to calibrate the current after receiving the first signal, based on a voltage sampled from the fractional-N synthesizer; and a current source array coupled to the calibration component and the fractional N synthesizer, the current source array being configured to calibrate the current based on the second signal.

19 Claims, 4 Drawing Sheets

FREQUENCY SYNTHESIZER

RELATED APPLICATIONS

This application is based upon and claims the benefit of priority from Provisional Application No. 60/960,983, filed Oct. 24, 2007, the entire contents of which are incorporated herein by reference.

FIELD OF THE INVENTION

This invention pertains in general to frequency synthesizers.

BACKGROUND OF THE INVENTION

A frequency synthesizer is an electronic device for providing an output frequency based on an input reference frequency. For example, a fractional-N synthesizer is a frequency synthesizer widely used in many modern devices, including radio receivers, mobile telephones, global positioning systems, etc. The fractional-N synthesizer has advantages over other types of frequency synthesizers, including reduced generation of phase noise and spur levels.

FIG. 1 illustrates a conventional fractional-N synthesizer 100. The fractional-N synthesizer 100 is configured to generate an output signal $S_{out}$ with a frequency $f_{out}$ based on an input signal $S_{ref}$ with a reference frequency $f_{ref}$ generated by a clock source, such as a crystal oscillator (not shown). The output frequency $f_{out}$ is approximately equal to the reference frequency $f_{ref}$ multiplied by an adjustable factor D, where the factor D can be an integer or non-integer.

Referring to FIG. 1, the fractional-N synthesizer 100 includes a phase/frequency detector (PFD) 102, a charge pump 104 coupled to the PFD 102, a voltage controlled oscillator (VCO) 106 coupled to the charge pump 104, a loop filter 108 coupled to a node between the charge pump 104 and the VCO 106, and a frequency divider 110 coupled between the VCO 106 and the PFD 102. The frequency divider 110 is configured to provide the adjustable factor D such that the output frequency $f_{out}$ may be adjusted by adjusting the factor D.

The charge pump 104 includes first and second current sources 104-1 and 104-2 coupled in series via a node N. The current sources 104-1 and 104-2 may be metal-oxide-semiconductor (MOS) transistors and provide first and second currents $I_{up}$ and $I_{down}$, respectively. For example, the current source 104-1 may be a PMOS transistor, and the current source 104-2 may be an NMOS transistor.

The charge pump 104 and the loop filter 108 produce a voltage $V_N$ at the node N, that is applied to the VCO 106. The VCO 106 generates the output signal $S_{out}$ with the frequency $f_{out}$ that varies with the voltage $V_N$. For example, the frequency $f_{out}$ of the output signal $S_{out}$ may increase as the voltage $V_N$ increases. The frequency divider 110 receives the output signal $S_{out}$ with the frequency $f_{out}$ and generates a feedback signal $S_{fb}$ with a frequency $f_{fb}$ approximately equal to 1/D of the frequency $f_{out}$.

The PFD 102 receives the input signal $S_{ref}$ with the reference frequency $f_{ref}$ and the feedback signal $S_{fb}$ with the frequency $f_{fb}$, and compares a phase or frequency difference between the input signal $S_{ref}$ and the feedback signal $S_{fb}$. The PFD 102 further provides first and second switch signals $S_{up}$ and $S_{down}$ to turn on the first and second current sources 104-1 and 104-2, respectively, based on the phase or frequency difference.

For example, if the PFD 102 determines that the frequency $f_{fb}$ of the feedback signal $S_{fb}$ is smaller than the reference frequency $f_{ref}$ of the input signal $S_{ref}$, the PFD 102 may send the first switch signal $S_{up}$ to turn on the first current source 104-1. Accordingly, the current $I_{up}$ provided by the first current source 104-1 charges the loop filter 108, such that the voltage $V_N$ applied to the VCO 106 increases. As a result, the frequency $f_{out}$ of the output signal $S_{out}$ and, hence, the frequency $f_{fb}$ of the feedback signal $S_{fb}$ also increase.

Also, for example, if the PFD 102 determines that the frequency $f_{fb}$ is larger than the reference frequency $f_{ref}$, the PFD 102 may send the second switch signal $S_{down}$ to turn on the second current source 104-2. Accordingly, the current $I_{down}$ provided by the second current source 104-2 discharges the loop filter 108, such that the voltage $V_N$ applied to the VCO 106 decreases. As a result, the frequency $f_{out}$ of the output signal $S_{out}$ and, hence, the frequency $f_{fb}$ of the feedback signal $S_{fb}$ also decrease.

These operations are repeated until the PFD 102 determines that the frequency $f_{fb}$ is approximately equal to the reference frequency $f_{ref}$, which corresponds to a state in which the fractional-N synthesizer 100 is in a locked condition. In the locked condition, the fractional-N synthesizer 100 generates the output signal $S_{out}$ with the frequency $f_{out}$ approximately equal to the reference frequency $f_{ref}$ multiplied by the factor D.

In the locked condition, the PFD 102 sends the switch signals $S_{up}$ and $S_{down}$ to turn on the first and second current sources 104-1 and 104-2 for substantially the same short period of time. Ideally, the current $I_{up}$ provided by the current source 104-1 is substantially the same as the current $I_{down}$ provided by the current source 104-2. Therefore the charge pump 104 outputs a zero net current when the fractional-N synthesizer 100 is in the locked condition. However, in reality, there may be a charge pump current mismatch such that the current $I_{up}$ may be not equal to the current $I_{down}$. For example, a difference between drain-source voltages applied to the PMOS transistor and the NMOS transistor, respectively operating as the first and second current sources 104-1 and 104-2, may cause the current mismatch.

As a result, the charge pump 104 may output a net current $I_0$, which is the difference between the first and second currents $I_{up}$ and $I_{down}$, when the fractional-N synthesizer 100 is in the locked condition. The net current $I_0$ may flow into or out of the charge pump 104 via the node N depending on whether the current $I_{up}$ is smaller or larger than the current $I_{down}$. The current mismatch may degrade performance of the fractional-N synthesizer 100.

SUMMARY OF THE INVENTION

In accordance with the invention, there is provided a frequency synthesizer, comprising: a fractional-N synthesizer configured to provide, in a locked condition, an output signal with an output frequency based on an input signal with a reference frequency, the fractional-N synthesizer including a charge pump outputting a current to be calibrated; a lock detector coupled to the fractional-N synthesizer to detect the locked condition, the lock detector being configured to send a first signal indicating the detection; a calibration component coupled to the lock detector and the fractional-N synthesizer, the calibration component being configured to provide a second signal to calibrate the current after receiving the first signal, based on a voltage sampled from the fractional-N synthesizer; and a current source array coupled to the calibration component and the fractional N synthesizer, the current source array being configured to calibrate the current based on the second signal.

Also in accordance with the invention, there is provided an apparatus for charge pump current mismatch calibration of a frequency synthesizer, the frequency synthesizer including a first charge pump outputting a current to be calibrated, the calibration apparatus comprising: a timing generator configured to provide first and second switch signals; a second charge pump coupled to the timing generator, the second charge pump including first and second current sources, the first current source providing a first current in response to the first switch signal, the second current source providing a second current in response to the second switch signal, the second charge pump being substantially the same as the first charge pump; a current source array coupled to the second charge pump and including a plurality of current sources coupled in parallel; an integrator circuit coupled to the second charge pump and the current source array, the integrator circuit being configured to provide a voltage based on a voltage sampled from the frequency synthesizer and a total current provided by the second charge pump and the current source array; a comparator coupled to the integrator circuit, the comparator being configured to determine whether further calibration is needed based on the voltage provided by the integrator circuit; a counter coupled to the comparator, the counter being configured to increase a count value by one if the comparator determines further calibration is needed, and to output a count signal corresponding to the count value; and an adder coupled to the counter, the adder being configured to add the count signal to an initial signal to provide a calibration signal to the current source array, and to output the calibration signal to the frequency synthesizer if the comparator determines no further calibration is needed.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the principles of the invention.

DESCRIPTION OF THE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

Figure 1:
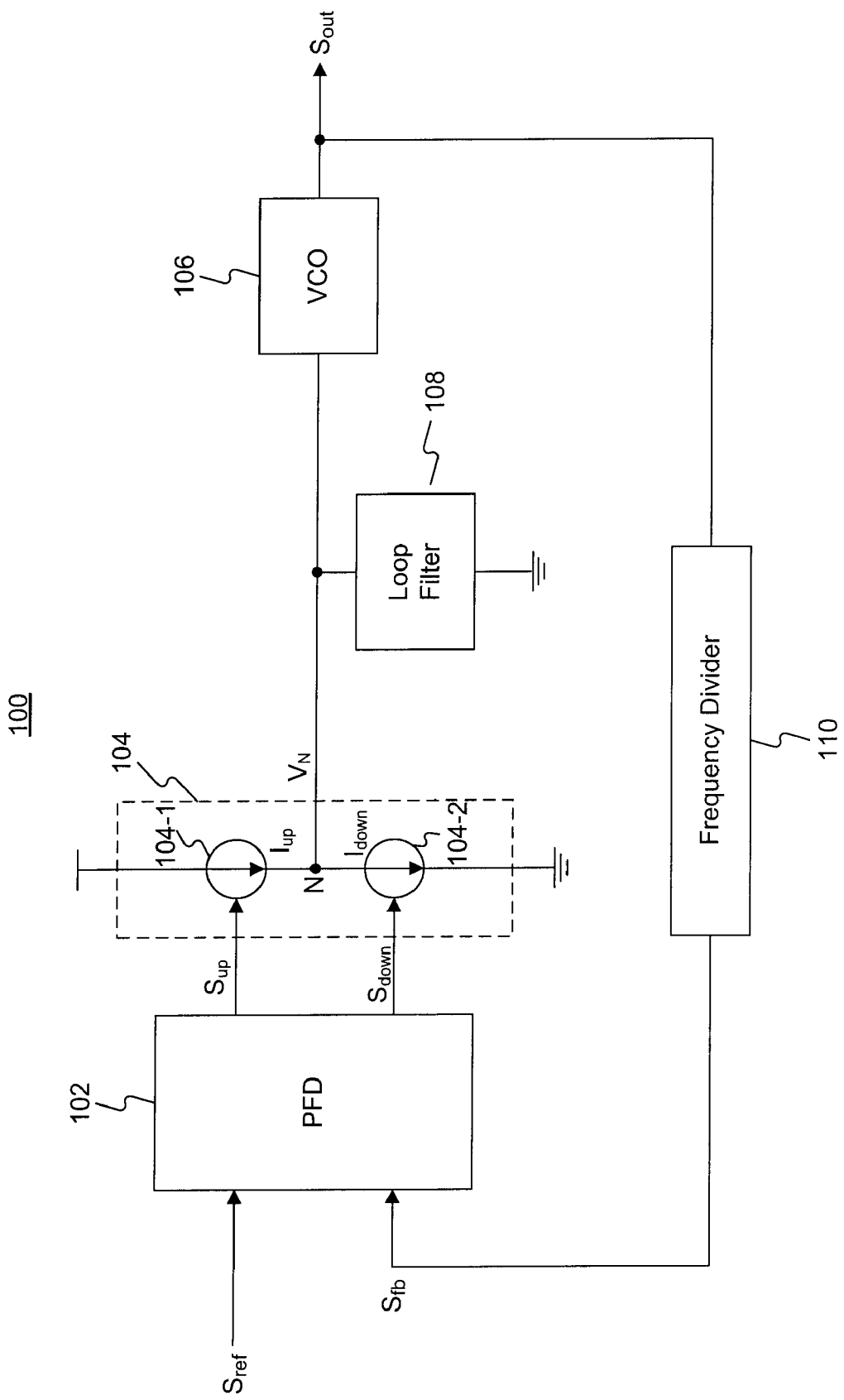
FIG. 1 illustrates a schematic block diagram of a conventional fractional-N synthesizer.
Figure 2:
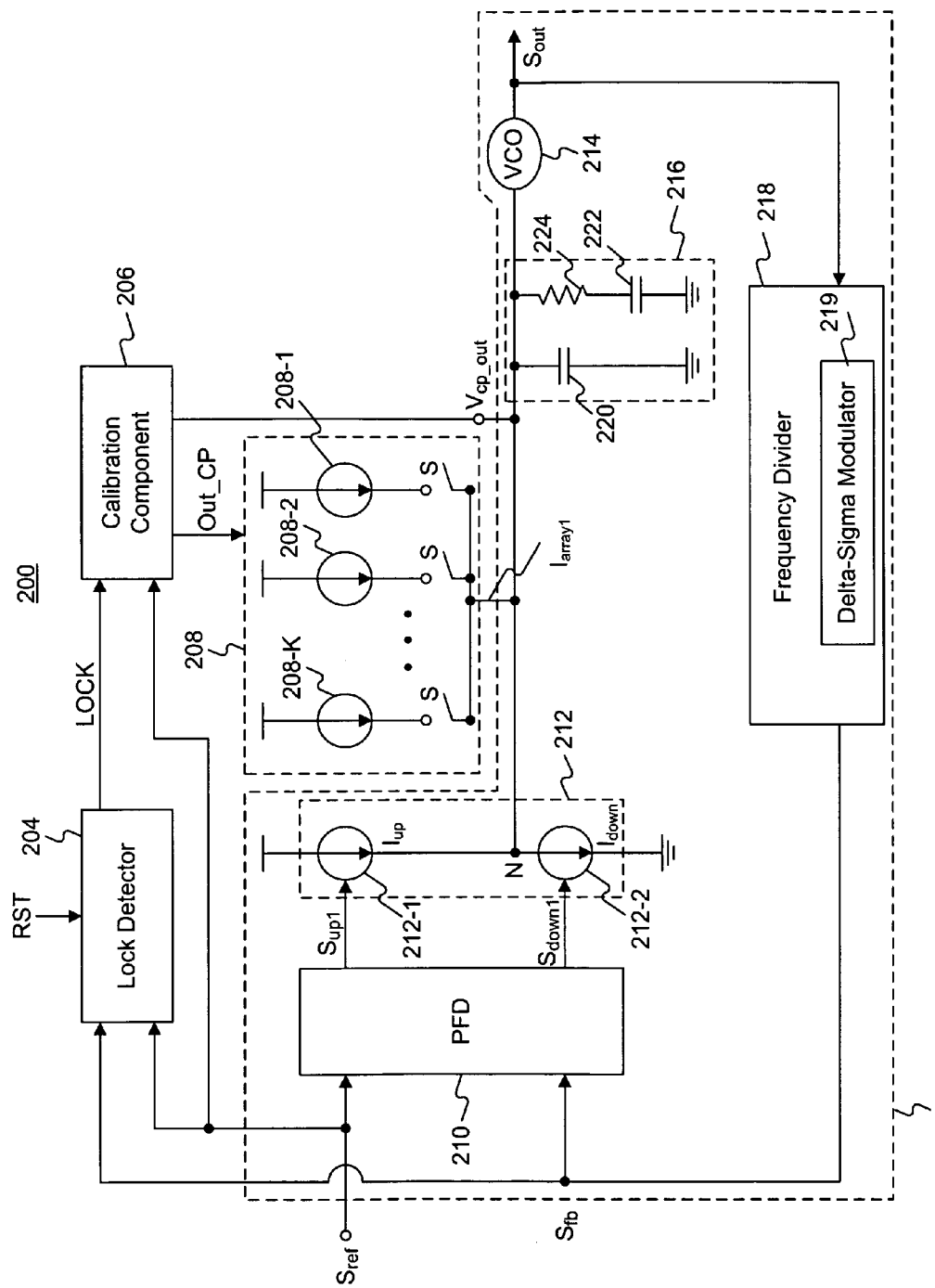
FIG. 2 illustrates a schematic block diagram of a frequency synthesizer with charge pump current mismatch calibration, according to an exemplary embodiment.

FIG. 2 illustrates a schematic block diagram of a frequency synthesizer 200 with charge pump current mismatch calibration, according to an exemplary embodiment. The frequency synthesizer 200 includes a fractional-N synthesizer 202, a lock detector 204, a calibration component 206, and a current source array 208.

The fractional-N synthesizer 202 is configured to generate an output signal $S_{out}$ with a frequency $f_{out}$ based on an input signal $S_{ref}$ with a reference frequency $f_{ref}$ generated by a clock source such as a crystal oscillator (not shown). For example, the output frequency $f_{out}$ may be approximately equal to the reference frequency $f_{ref}$ multiplied by an adjustable factor D, where the factor D can be an integer or non-integer. In exemplary embodiments consistent with the present invention, the fractional-N synthesizer 202 includes a phase/frequency detector (PFD) 210, a charge pump 212 coupled to the PFD 210, a voltage controlled oscillator (VCO) 214 coupled to the charge pump 212, a loop filter 216 coupled to a node between the charge pump 212 and the VCO 214, and a frequency divider 218 coupled between the VCO 214 and the PFD 210. The frequency divider 218 is configured to provide the adjustable factor D such that the output frequency $f_{out}$ may be adjusted by adjusting the factor D.

In one exemplary embodiment, the charge pump 212 includes first and second current sources 212-1 and 212-2 coupled in series via a node N. The current sources 212-1 and 212-2 provide first and second currents $I_{up}$ and $I_{down}$, respectively. For example, the current source 212-1 may be a PMOS transistor, and the current source 212-2 may be an NMOS transistor. Ideally, the current $I_{up}$ provided by the current source 212-1 is substantially the same as the current $I_{down}$ provided by the current source 212-2. In reality, the current $I_{up}$ provided by the current source 212-1 may be not equal to the current $I_{down}$ provided by the current source 212-2. As a result, the charge pump 212 may output a net current $I_0$, which is the difference between the currents $I_{up}$ and $I_{down}$.

In one exemplary embodiment, the loop filter 216 may include a first capacitor 220, a second capacitor 222, and a resistor 224. The first capacitor 220 is coupled in parallel with the second capacitor 222 and the resistor 224, and the second capacitor 222 and the resistor 224 are coupled in series. The charge pump 212 and the loop filter 216 may produce a voltage $V_{cp\_out}$ at the node N, that is applied to the VCO 214.

In one exemplary embodiment, the VCO 214 is configured to generate the output signal $S_{out}$ with the frequency $f_{out}$ varying with the voltage $V_{cp\_out}$. For example, the frequency $f_{out}$ may increase as the voltage $V_{cp\_out}$ increases. The frequency divider 218 receives the output signal $S_{out}$ with the frequency $f_{out}$ and generates a feedback signal $S_{fb}$ with a frequency $f_{fb}$ equal to 1/D of the frequency $f_{out}$, or $f_{fb}=f_{out}/D$. In one exemplary embodiment, the frequency divider 218 includes a Delta-Sigma modulator 219.

In exemplary embodiments consistent with the present invention, the PFD 210 is configured to receive the input signal $S_{ref}$ with the reference frequency $f_{ref}$ and the feedback signal $S_{fb}$ with the frequency $f_{fb}$, and to compare a phase or frequency difference between the input signal $S_{ref}$ and the feedback signal $S_{fb}$. The PFD 210 is further configured to provide first and second switch signals $S_{up1}$ and $S_{down1}$ to turn on the first and second current sources 212-1 and 212-2, respectively.

In one exemplary embodiment, the current source array 208 includes a plurality of current sources 208-1, 208-2, ..., 208-K (K is the total number of the current sources) coupled in parallel to the node N. Each of the current sources 208-1, 208-2, . . . 208-K can be turned on by a switch S. By turning on different combinations of the current sources 208-1, 208-2, . . . , 208-K, the current source array 208 may provide a charging or discharging current $I_{array1}$ which is adjustable. In one exemplary embodiment, the current $I_{array1}$ may be much smaller than the currents $I_{up}$ and $I_{down}$ respectively provided by the current sources 212-1 and 212-2. Also, for example, the current $I_{array1}$ is a charging current when flowing out of the current source array 208, and is a discharging current when flowing into the current source array 208. Further, for example, the plurality of current sources 208-1, 208-2, . . . , 208-K are configured to respectively provide currents increasing at a fixed ratio A, such that the $i^{th}$ current source 208-$i$ provides an $i^{th}$ current $A^{i-1} \times I_1$ ($i=1, 2, \ldots, K$), where $I_1$ is a current provided by the current source 208-1.

Figure 3:
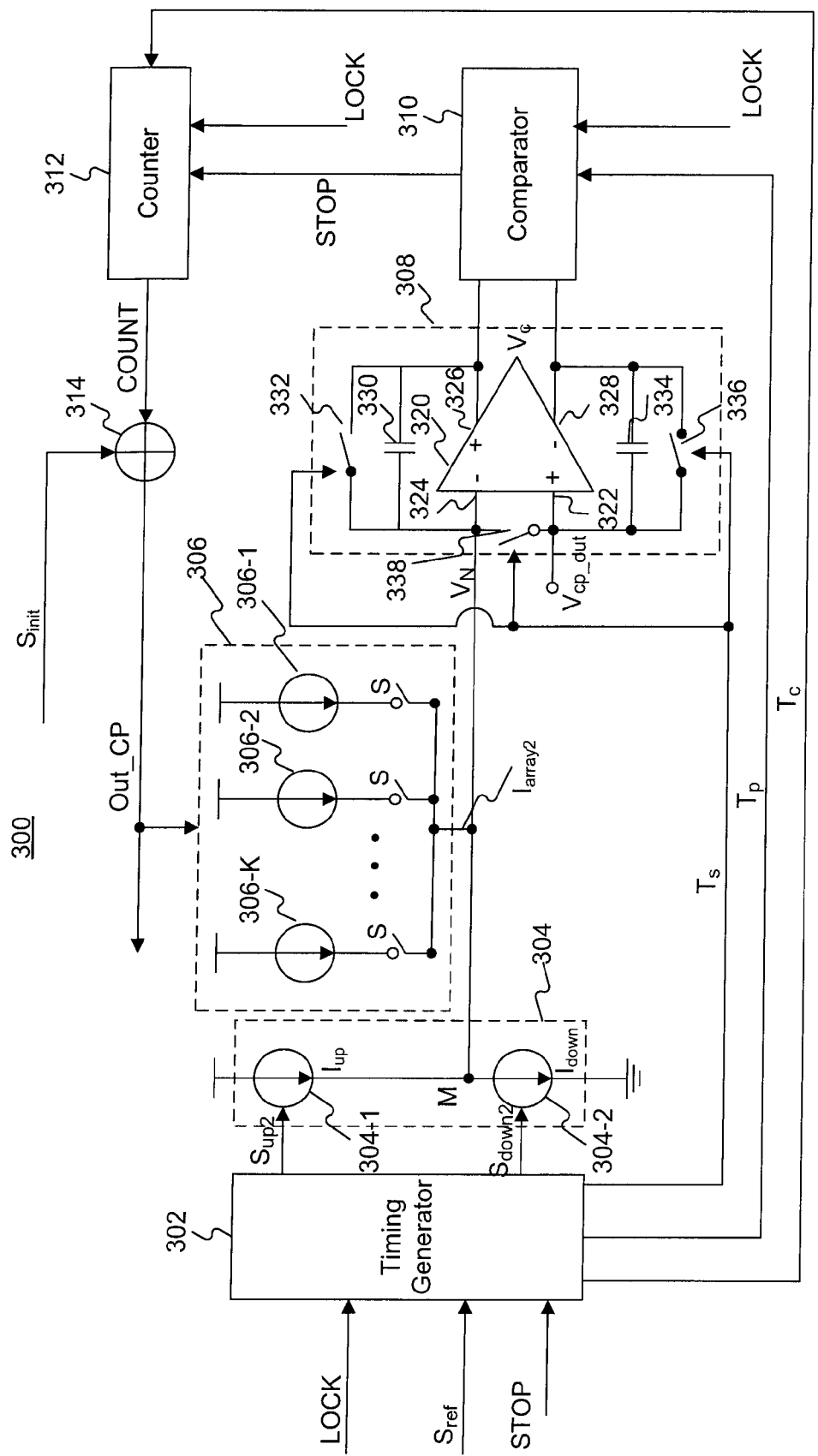
FIG. 3 illustrates a schematic block diagram of an apparatus for charge pump current mismatch calibration, according to an exemplary embodiment.

FIG. 3 illustrates a schematic block diagram of an apparatus 300 for charge pump current mismatch calibration, according to an exemplary embodiment. The apparatus 300 is an exemplary implementation of the calibration component 206 in FIG. 2. The calibration apparatus 300 includes a timing generator 302, a charge pump 304, a current source array 306, an integrator circuit 308, a comparator 310, a counter 312, and an adder 314.

In exemplary embodiments consistent with the present invention, the timing generator 302 is configured to receive a signal LOCK from a lock detector such as the lock detector 204 (FIG. 2), a signal STOP from the comparator 310, and the input signal $S_{ref}$. The timing generator 302 is further configured to generate first, second, and third timing signals $T_s$, $T_p$, and $T_c$ for the integrator circuit 308, the comparator 310, and the counter 312, respectively, and first and second switch signals $S_{up2}$ and $S_{down2}$ for the charge pump 304.

The charge pump 304 is substantially the same as the charge pump 212 (FIG. 2). For example, the charge pump 304 includes first and second current sources 304-1 and 304-2 coupled via a node M, which provide substantially the same currents $I_{up}$ and $I_{down}$ as the current sources 212-1 and 212-2 (FIG. 2), respectively. Therefore the charge pump 304 produces substantially the same net current $I_0$ as the charge pump 212 (FIG. 2). The charge pump 304 is coupled to the timing generator 302 to receive the first and second switch signals $S_{up2}$ and $S_{down2}$ from the timing generator 302 that may turn on the first and second current sources 304-1 and 304-2, respectively.

The current source array 306 is substantially the same as the current source array 208 (FIG. 2). For example, the current source array 306 includes a plurality of current sources 306-1, 306-2, . . . , 306-K coupled in parallel to the node M, corresponding to and providing substantially the same current as the current sources 208-1, 208-2, . . . , 208-K (FIG. 2), respectively. Also, for example, if the plurality of current sources 208-1, 208-2, . . . , 208-K are configured to respectively provide currents increasing at the fixed ratio A, such that the $i^{th}$ current source 208-$i$ provides an $i^{th}$ current $A^{i-1} \times I_1$ ($i=1, 2, \ldots, K$), the plurality of current sources 306-1, 306-2, . . . , 306-K are also configured to respectively provide currents increasing at the same fixed ratio A, such that the $i^{th}$ current source 306-$i$ provides an $i^{th}$ current $A^{i-1} \times I_1$ ($i=1, 2, \ldots, K$), where $I_1$ is a current provided by the current source 208-1 or 306-1. Each of the current sources 306-1, 306-2, . . . , 306-K can be turned on by a switch S. By turning on different combinations of the current sources 306-1, 306-2, . . . , 306-K, the current source array 306 may provide a charging or discharging current $I_{array2}$ which is adjustable.

The integrator circuit 308 is coupled to the timing generator 302, the charge pump 304, and the current source array 306. In one exemplary embodiment, the integrator circuit 308 includes an operational amplifier 320, first and second input terminals INP 322 and INN 324, and first and second output terminals OUTP 326 and OUTN 328. The integrator circuit 308 further includes a first capacitor 330 and a first switch 332 coupled in parallel and coupled between the input terminal INN 324 and the output terminal OUTP 326, a second capacitor 334 and a second switch 336 coupled in parallel and coupled between the input terminal INP 322 and the output terminal OUTN 328, and a third switch 338 coupled between the input terminals INP 322 and INN 324. The first, second, and third switches 332, 336, and 338 are controlled by the timing signal $T_s$ received from the timing generator 302. For example, a first value of the timing signal $T_s$ closes the first, second, and third switches 332, 336, and 338 to reset the integrator circuit 308, and a second value of the timing signal $T_s$ opens the first, second, and third switches 332, 336, and 338. Further, the integrator circuit 308 receives at the input terminal INP 322 a sampled voltage such as the voltage $V_{cp\_out}$ applied to the VCO 214 (FIG. 2), and provides an output voltage $V_c$ across the output terminals OUTP 326 and OUTN 328.

In exemplary embodiments consistent with the present invention, the comparator 310 is coupled to the integrator circuit 308 to receive the voltage $V_c$, and coupled to the timing generator 302 to receive the timing signal $T_p$. In addition, the comparator 310 is configured to output the signal STOP to the timing generator 302 and the counter 312, the signal STOP being based on the voltage $V_c$ received from the integrator circuit 308.

In exemplary embodiments consistent with the present invention, the counter 312 is coupled to the comparator 310 to receive the signal STOP and coupled to the timing generator 302 to receive the timing signal $T_c$. The counter 312 is further configured to output a signal COUNT corresponding to a count value to the adder 314. For example, the signal COUNT may have K bits, or the same number of bits as the number of current sources in the current source array 306 and, hence, the number of current sources in the current source array 208 (FIG. 2). In one exemplary embodiment, the counter 312 is implemented using a Finite State Machine method.

The adder 314 is configured to receive the signal COUNT from the counter 312, and to add the signal COUNT to an initial signal $S_{init}$, which also has K bits, to provide a calibration signal Out_CP to the current source array 306. For example, the initial signal $S_{init}$ may come from an inter-integrated circuit (I2C) not shown in FIG. 3. The calibration signal Out_CP also has K bits, or the same number of bits as the number of current sources in the current source array 306 and, hence, the number of current sources in the current source array 208 (FIG. 2). In one exemplary embodiment, the calibration signal Out_CP may be temporarily stored in the adder 314, and be updated when the adder 314 receives the signal COUNT with an updated value from the counter 312 and adds the signal COUNT with the updated value to the initial signal $S_{init}$. The calibration signal Out_CP is used to control the switches S to turn on/off each corresponding current source 306-1, 306-2, . . . , 306-K in the current source array 306.

For example, if the K-bit signal Out_CP is "00 . . . 01," the signal Out_CP controls the switches S to turn on the first current source 306-1 and turn off the current sources 306-2, 306-3, . . . , 306-K. Also, for example, if the K-bit signal Out_CP is "0 . . . 011," the signal Out_CP controls the switches S to turn on the first and second current sources 306-1 and 306-2, and turn off the current sources 306-3, ..., 306-K. By turning on different combinations of the current sources 306-1, 306-2, ... 306-K using the signal Out_CP, the current source array 306 may adjustably provide the current $I_{array2}$.

Operation of the illustrated exemplary embodiment is described next. Referring back to FIG. 2, when the frequency synthesizer 200 starts operation, the factor D provided by the frequency divider 218 is adjusted to a value based on a desired output frequency $f_{out0}$, and the frequency $f_{fb}$ of the feedback signal $S_{fb}$ is not equal to the reference frequency $f_{ref}$ of the input signal $S_{ref}$. Therefore, there is a phase or frequency difference between the signals $S_{fb}$ and $S_{ref}$. The PFD 210 compares the phase or frequency difference, and outputs the first and second switch signals $S_{up1}$ and $S_{down1}$ to the charge pump 212. The switch signals $S_{up1}$ and $S_{down1}$ may turn on the first and second current sources 212-1 and 212-2, respectively.

For example, if the PFD 210 determines that the frequency $f_{fb}$ of the feedback signal $S_{fb}$ is smaller than the reference frequency $f_{ref}$ of the input signal $S_{ref}$, the PFD 210 may send the first switch signal $S_{up1}$ to turn on the first current source 212-1. Accordingly, the current $I_{up}$ provided by the first current source 212-1 charges the loop filter 216, such that the voltage $V_{cp\_out}$ applied to the VCO 214 increases. As a result, the frequency $f_{out}$ of the output signal $S_{out}$ and, hence, the frequency $f_{fb}$ of the feedback signal $S_{fb}$ also increase.

Also, for example, if the PFD 210 determines that the frequency $f_{fb}$ is larger than the reference frequency $f_{ref}$, the PFD 210 may send the second switch signal $S_{down1}$ to turn on the second current source 212-2. Accordingly, the current $I_{down}$ provided by the second current source 212-2 discharges the loop filter 216, such that the voltage $V_{cp\_out}$ applied to the VCO 216 decreases. As a result, the frequency $f_{out}$ of the output signal $S_{out}$ and, hence, the frequency $f_{fb}$ of the feedback signal $S_{fb}$ also decrease.

These operations are repeated until the PFD 210 determines that the frequency $f_{fb}$ is approximately equal to the frequency $f_{ref}$, which corresponds to a state in which the fractional-N synthesizer 202 is in a locked condition. In the locked condition, the fractional-N synthesizer 202 generates the output signal $S_{out}$ with the desired frequency $f_{out0}$, which is approximately equal to the reference frequency $f_{ref}$ multiplied by the factor D.

As noted above, in reality, there may be charge pump current mismatch such that the current $I_{up}$ provided by the current source 212-1 may be not equal to the current $I_{down}$ provided by the current source 212-2. As a result, the charge pump 212 may output the net current $I_0$, which represents a current to be calibrated, when the fractional-N synthesizer 202 is in the locked condition. The lock detector 204, the calibration component 206, and the current source array 208 then perform charge pump current mismatch calibration.

Figure 4:
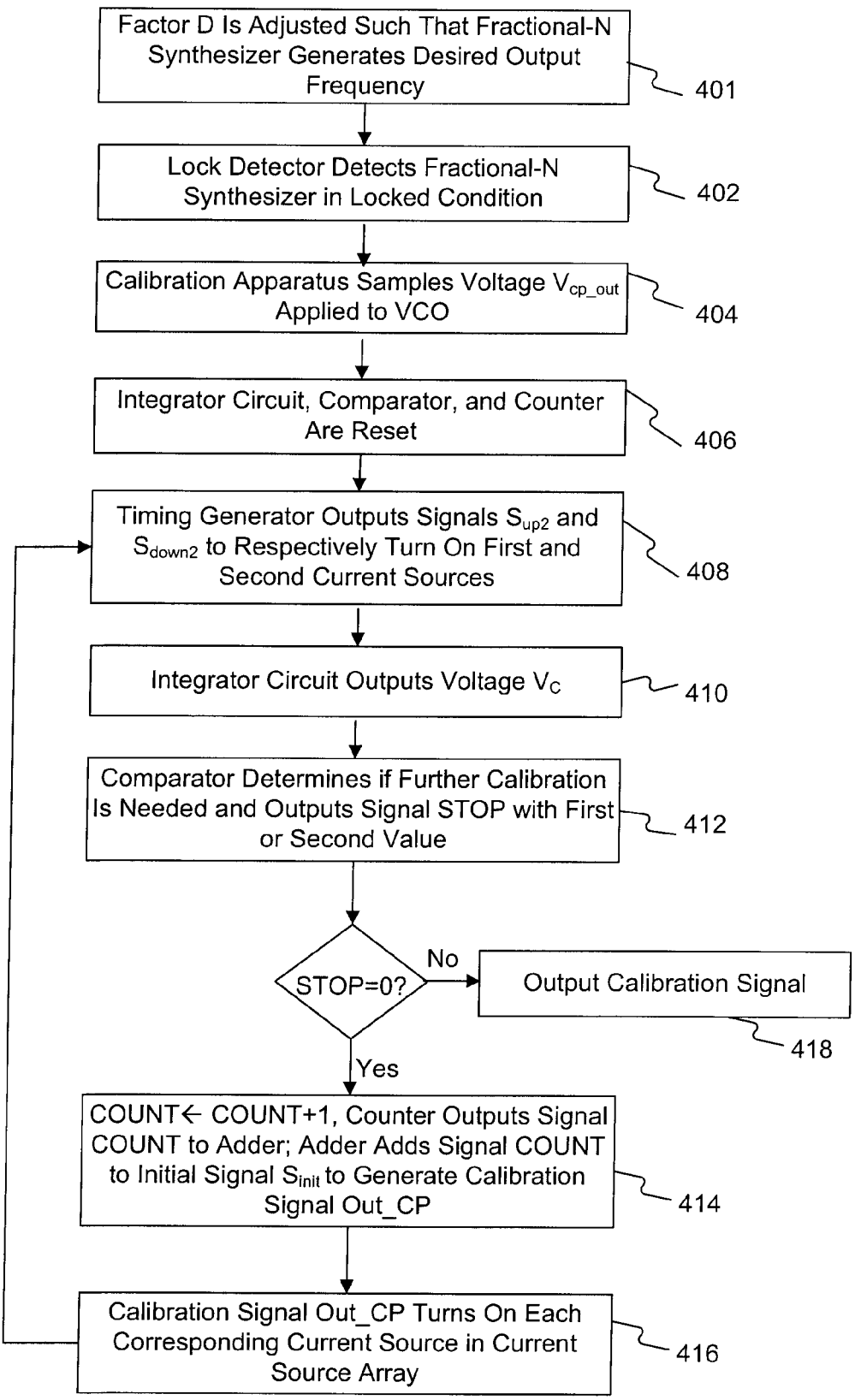
FIG. 4 illustrates a flowchart of a method for a frequency synthesizer to perform charge pump current mismatch calibration, according to an exemplary embodiment.

FIG. 4 illustrates a flowchart of an exemplary method for the frequency synthesizer 200 (FIG. 2) to perform charge pump current mismatch calibration, according to an exemplary embodiment. Solely for the purpose of explaining the exemplary method, it is assumed that the current sources 208-1, 208-2, ..., 208-K of the current source array 208 are all turned off before the frequency synthesizer 200 starts operation. It is further assumed that the current $I_{up}$ provided by the current source 212-1 is smaller than the current $I_{down}$ provided by the current source 212-2, and the current array 208 may provide the charging current $I_{array1}$ flowing out of the current array 208 after the calibration.

As previously explained, the charge pump 304 and the current source array 306 (FIG. 3) are substantially the same as the charge pump 212 and the current source array 208, respectively. For example, the current $I_{up}$ provided by the current source 304-1 is substantially the same as the current $I_{up}$ provided by the current source 212-1, and the current $I_{down}$ provided by the current source 304-2 is substantially the same as the current $I_{down}$ provided by the current source 212-2. Also, for example, the current sources 306-1, 306-2, ..., 306-K of the current source array 306 are turned off before the frequency synthesizer 200 starts operation. In the illustrated embodiment, the current array 306 may provide the charging current $I_{array2}$ flowing out of the current array 306 during the calibration.

Referring to FIGS. 2 and 4, as explained above, the factor D provided by the frequency divider 218 is adjusted such that the fractional-N synthesizer 202 generates the output signal $S_{out}$ with the desired frequency $f_{out0}$ in the locked condition (step 401). The lock detector 204 detects the fractional-N synthesizer 202 is in the locked condition and charge pump current mismatch calibration starts (step 402). For example, the lock detector 204 receives the feedback signal $S_{fb}$ from the frequency divider 218 and the input signal $S_{ref}$, and compares the frequency $f_{fb}$ of the signal $S_{fb}$ with the reference frequency $f_{ref}$ of the input signal $S_{ref}$. If the lock detector 204 determines that the frequency $f_{fb}$ is approximately equal to the reference frequency $f_{ref}$, the lock detector 204 detects the fractional-N synthesizer 202 is in the locked condition. In one exemplary embodiment, the inter-integrated circuit noted above may send a reset signal RST to reset the lock detector 204 after each comparison.

The lock detector 204 outputs to the calibration component 206 the signal LOCK indicating that the fractional-N synthesizer 202 is in the locked condition. Upon receiving the signal LOCK from the lock detector 204, the calibration component 206 samples the voltage $V_{cp\_out}$ applied to the VCO 214 (step 404).

Referring to FIGS. 3 and 4, the timing generator 302 receives the signal LOCK from the lock detector 204 (FIG. 2) and the input signal $S_{ref}$, and the integrator circuit 308 receives the sampled voltage $V_{cp\_out}$ at the input terminal INP 322. In addition, the comparator 310 and the counter 312 each also receive the signal LOCK from the lock detector 204 (FIG. 2) and are reset upon receiving the signal LOCK, and the timing generator 302 outputs the signal $T_s$ with the first value to reset the integrator circuit 308 by closing the switches 330, 334, and 338 (step 406). As a result, for example, the counter 312 may have an initial count value 0 after being reset.

The timing generator 302 further outputs the first and second signals $S_{up2}$ and $S_{down2}$ to the charge pump 304, and outputs the timing signal $T_s$ with the second value to the integrator circuit 308 to open the switches 332, 334, and 338. For example, the first and second signals $S_{up2}$ and $S_{down2}$ respectively turn on the current sources 304-1 and 304-2 for substantially the same period $T_0$ (step 408).

During the period $T_0$ when current sources 304-1 and 304-2 are turned on, a total current $I_{t2}$ may be provided by the charge pump 304 and the current source array 306. In general that total current $I_{t2}$ produces a voltage $V_N$ at the input terminal INN 324 of integrator circuit 308. For the present example, however, the current sources 306-1, 306-2, ..., 306-K of the current source array 306 are all turned off before the frequency synthesizer 200 (FIG. 2) starts operation, and therefore only the net current $I_0$ provided by the charge pump 304 produces the voltage $V_N$ initially.

The integrator circuit 308 outputs the voltage $V_C$ (step 410), according to the sampled voltage $V_{cp\_out}$ at the input terminal INP 322 and the voltage $V_N$ at the input terminal INN 324. The voltage $V_C$ is proportional to a difference between the voltage $V_{cp\_out}$ and the voltage $V_N$. As noted above, the voltage $V_N$ is produced by the total current $I_{t2}$ provided by the charge pump 304 and the current source array 306. Therefore the voltage $V_C$ outputted by the integrator circuit 308 also changes with the total current $I_{t2}$. In one exemplary embodiment, initially, the voltage $V_C$ outputted by the integrator circuit 308 may increase with time when the total current $I_{t2}$ includes only the net current $I_0$ provided by the charge pump 304. As the total current $I_{t2}$ decreases due to the increased current $I_{array2}$ provided by the current source array 306, the voltage $V_C$ outputted by the integrator circuit 308 may increase with time at a reduced rate. When the total current $I_{t2}$ decreases towards zero and then changes its direction, the voltage $V_C$ outputted by the integrator circuit 308 may change its polarity.

After sending the timing signal $T_s$ with the second value, the timing generator 302 also sends the timing signal $T_p$ to the comparator 310. Upon receiving the timing signal $T_p$ from the timing generator 302, the comparator 310 determines whether further calibration of charge pump current mismatch is needed, and outputs the signal STOP with a first or second value to the timing generator 302 and the counter 312 (step 412). For example, the comparator 310 may determine whether the polarity of the voltage $V_C$ has changed. If the comparator 310 determines the polarity of the voltage $V_C$ has not changed, the comparator 310 outputs the signal STOP with the first value, e.g., "0," to the timing generator 302 and the counter 312, indicating further calibration is needed. Alternatively, if the comparator 310 determines the polarity of the voltage $V_C$ has changed, the comparator 310 outputs the signal STOP with the second value, e.g., "1," to the timing generator 302 and the counter 312, indicating no further calibration is needed.

After sending the timing signal $T_p$, the timing generator 302 further sends the timing signal $T_c$ to the counter 312. If the counter 312 receives a "0" as the signal STOP, the counter 312 increases the count value by one upon receiving the timing signal $T_c$, and outputs the signal COUNT corresponding to the increased count value to the adder 314. The adder 314 further adds the signal COUNT to the initial signal $S_{init}$ to generate the calibration signal Out_CP for the current source array 306 (step 414). For example, the current sources 306-1, 306-2, . . . , 306-K are all turned off before the frequency synthesizer 200 starts operation, so that the initial signal $S_{init}$ may be "00 . . . 0" (K bits) initially. In addition, the timing generator 302 outputs the signal $T_s$ with the first value to reset the integrator circuit 308 by closing the switches 330, 334, and 338.

The calibration signal Out_CP turns on/off each corresponding current source in the current source array 306 (step 416). In one exemplary embodiment, as the count value provided by the counter 312 increases, the current $I_{array2}$ provided by the current source array 306 also increases. As a result, the total current $I_{t2}$ provided by the charge pump 304 and the current source array 306 decreases.

The calibration apparatus 300 performs further calibration as described above beginning from step 408. The calibration signal Out_CP is updated in each calibration until the comparator 310 determines no further calibration is needed and outputs a "1" as the signal STOP. For example, the comparator 310 determines no further calibration is needed when the polarity of the voltage $V_C$ based on the signal Out_CP with a current value has changed. Accordingly, the total current $I_{t2}$ corresponding to the calibration signal Out_CP has a current value that is a minimum or approximately zero. The apparatus 300 then outputs the calibration signal Out_CP with the current value to the current source array 208 (FIG. 2) (step 418).

Referring back to FIG. 2, the calibration signal Out_CP with the current value turns on/off each corresponding current course 208-1, 208-2, . . . , 208-K in the current source array 208. A total current $I_{t1}$ provided by the charge pump 212 and the current source array 208 is substantially the same as the total current $I_{t2}$ provided by the charge pump 304 and the current source array 306 (FIG. 3). As noted above, the total current $I_{t2}$ corresponding to the calibration signal Out_CP has a current value that is a minimum or approximately zero. Accordingly, the total current $I_{t1}$ corresponding to the calibration signal Out_CP has a current value that is also a minimum or approximately zero. Therefore charge pump current mismatch calibration of the fractional-N synthesizer 202 is achieved.

In one exemplary embodiment, the factor D provided by the frequency divider 218 is adjusted after the calibration is achieved, such that the fractional-N synthesizer 202 may generate the output signal $S_{out}$ with a new desired frequency $f_{out1}$. Accordingly, the fractional-N synthesizer 202 enters a new locked condition as described above. The lock detector 204, the calibration component 206, and the current source array 208 then perform charge pump current mismatch calibration by repeating steps 402-418.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made with out departing from the scope thereof. It is intended that the scope of the invention only be limited by the appended claims.

What is claimed is:

1. A frequency synthesizer, comprising:
 a fractional-N synthesizer configured to provide, in a locked condition, an output signal with an output frequency based on an input signal with a reference frequency, the fractional-N synthesizer including a first charge pump outputting a current to be calibrated;
 a lock detector coupled to the fractional-N synthesizer to detect the locked condition, the lock detector being configured to send a first signal indicating the detection;
 a calibration component coupled to the lock detector and the fractional-N synthesizer, the calibration component being configured to provide a second signal to calibrate the current after receiving the first signal, based on a voltage sampled from the fractional-N synthesizer; and
 a first current source array coupled to the calibration component and the fractional-N synthesizer, the first current source array being configured to calibrate the current based on the second signal;
 wherein the calibration component includes:
  a timing generator configured to receive the first signal indicating the detection of the locked condition and to provide first and second switch signals;
  a second charge pump coupled to the timing generator and including first and second current sources, the first current source providing a first current in response to the first switch signal, the second current source providing a second current in response to the second switch signal, the second charge pump being substantially the same as the first charge pump;

a second current source array coupled to the second charge pump and including a plurality of current sources coupled in parallel, the second current source array being substantially the same as the first current source array;

an integrator circuit coupled to the second charge pump and the second current source array, the integrator circuit being configured to provide a voltage based on the voltage sampled from the fractional-N synthesizer and a total current provided by the second charge pump and the second current source array;

a comparator coupled to the integrator circuit, the comparator being configured to determine whether further calibration is needed based on the voltage provided by the integrator circuit;

a counter coupled to the comparator, the counter being configured to increase a count value by one if the comparator determines further calibration is needed, and to output a count signal corresponding to the count value; and an adder coupled to the counter, the adder being configured to add the count signal to an initial signal to provide a calibration signal to the second current source array, and to output the calibration signal as the second signal to the first current source array if the comparator determines no further calibration is needed.

2. The frequency synthesizer of claim 1, wherein the fractional-N synthesizer comprises:

a phase/frequency detector configured to compare a phase or frequency difference between the input signal with the reference frequency and a feedback signal with a first frequency, and to provide third and fourth switch signals based on the phase or frequency difference;

the first charge pump being coupled to the phase/frequency detector and including third and fourth current sources, the third current source providing a third current in response to the third switch signal, the fourth current source providing a fourth current in response to the fourth switch signal, the current to be calibrated being approximately equal to a difference between the third and fourth currents;

a loop filter coupled to the first charge pump, the loop filter being configured to provide a voltage based on the third and fourth currents;

a voltage controlled oscillator coupled to the loop filter, the voltage controlled oscillator being configured to provide the output signal based on the voltage provided by the loop filter; and a frequency divider coupled to the voltage controlled oscillator, the frequency divider being configured to provide the feedback signal with the first frequency based on the output signal with the output frequency, the first frequency being proportional to the output frequency.

3. The frequency synthesizer of claim 2, wherein the loop filter comprises:

a first capacitor;

a second capacitor; and a first resistor coupled in series with the second capacitor; wherein the first capacitor is coupled in parallel with the second capacitor and the first resistor.

4. The frequency synthesizer of claim 2, wherein the frequency divider comprises a Delta-Sigma modulator.

5. The frequency synthesizer of claim 1, wherein the timing generator is configured to provide first, second, and third timing signals to the integrator circuit, the comparator, and the counter, respectively, wherein:

the integrator circuit provides the voltage in accordance with the first timing signal;

the comparator determines whether further calibration is needed in accordance with the second timing signal; and the counter increases the count value by one in accordance with the third timing signal.

6. The frequency synthesizer of claim 1, wherein the integrator circuit comprises:

an operational amplifier having first and second input terminals and first and second output terminals;

a first capacitor coupled between the second input terminal and the first output terminal; and a second capacitor coupled between the first input terminal and the second output terminal.

7. The frequency synthesizer of claim 6, wherein the integrator circuit further comprises:

a first switch coupled between the second input terminal and the first output terminal;

a second switch coupled between the first input terminal and the second output terminal; and a third switch coupled between the first and second input terminals.

8. The frequency synthesizer of claim 1, wherein the counter is implemented using a Finite State Machine method.

9. The frequency synthesizer of claim 1, wherein the first current source array comprises a plurality of current sources coupled in parallel, and is configured to provide an adjustable current based on the second signal provided by the calibration component.

10. The frequency synthesizer of claim 9, wherein the adjustable current is approximately equal to the current to be calibrated.

11. The frequency synthesizer of claim 9, wherein the second signal provided by the calibration component turns on at least one of the plurality of current sources of the first current source array to provide the adjustable current.

12. The frequency synthesizer of claim 9, wherein the plurality of current sources of the first current source array are configured to provide currents increasing at a fixed ratio.

13. Apparatus for charge pump current mismatch calibration of a frequency synthesizer, the frequency synthesizer including a first charge pump outputting a current to be calibrated, the calibration apparatus comprising:

a timing generator configured to provide first and second switch signals;

a second charge pump coupled to the timing generator, the second charge pump including first and second current sources, the first current source providing a first current in response to the first switch signal, the second current source providing a second current in response to the second switch signal, the second charge pump being substantially the same as the first charge pump;

a current source array coupled to the second charge pump and including a plurality of current sources coupled in parallel;

an integrator circuit coupled to the second charge pump and the current source array, the integrator circuit being configured to provide a voltage based on a voltage sampled from the frequency synthesizer and a total current provided by the second charge pump and the current source array;

a comparator coupled to the integrator circuit, the comparator being configured to determine whether further calibration is needed based on the voltage provided by the integrator circuit;

a counter coupled to the comparator, the counter being configured to increase a count value by one if the comparator determines further calibration is needed, and to output a count signal corresponding to the count value; and an adder coupled to the counter, the adder being configured to add the count signal to an initial signal to provide a calibration signal to the current source array, and to output the calibration signal to the frequency synthesizer if the comparator determines no further calibration is needed.

14. The apparatus of claim 13, wherein the timing generator is configured to provide first, second, and third timing signals to the integrator circuit, the comparator, and the counter, respectively, wherein:

the integrator circuit provides the voltage in accordance with the first timing signal;

the comparator determines whether further calibration is needed in accordance with the second timing signal; and the counter increases the count value by one in accordance with the third timing signal.

15. The apparatus of claim 13, wherein the integrator circuit comprises:

an operational amplifier having first and second input terminals, and first and second output terminals;

a first capacitor coupled between the second input terminal and the first output terminal; and a second capacitor coupled between the first input terminal and the second output terminal.

16. The apparatus of claim 13, wherein the counter is implemented using a Finite State Machine method.

17. The apparatus of claim 13, wherein the current source array is configured to provide an adjustable current based on the calibration signal provided by the adder.

18. The frequency synthesizer of claim 17, wherein the calibration signal provided by the adder turns on at least one of the plurality of current sources to provide the adjustable current.

19. The frequency synthesizer of claim 13, wherein the plurality of current sources are configured to provide currents increasing at a fixed ratio.

* * * * *